(12) United States Patent
Lin et al.

(10) Patent No.: US 6,982,195 B2
(45) Date of Patent: Jan. 3, 2006

(54) METHOD OF FORMING POLY-SILICON CRYSTALLIZATION

(75) Inventors: Jia-Xing Lin, Pan Chiao (TW);
Chi-Lin Chen, Hsinchu (TW);
Yu-Cheng Chen, Hsintien (TW)

(73) Assignee: Industrial Technology Research Institute, (TW)

( * ) Notice: Subject to any disclaimer, the term of this patent is extended or adjusted under 35 U.S.C. 154(b) by 111 days.

(21) Appl. No.: 10/780,589

(22) Filed: Feb. 19, 2004

(65) Prior Publication Data

US 2005/0136612 A1   Jun. 23, 2005

(30) Foreign Application Priority Data

Dec. 23, 2003  (TW) ............................... 92136606 A

(51) Int. Cl.
*H01L 21/84* (2006.01)
(52) U.S. Cl. ........................................ 438/166; 257/51
(58) Field of Classification Search ............ 257/49–52, 257/57, 61; 438/142, 150, 166, 662
See application file for complete search history.

(56) References Cited

U.S. PATENT DOCUMENTS

| | | | |
|---|---|---|---|
| 6,522,315 B2 * | 2/2003 | Ozawa et al. .................. 345/92 |
| 6,818,967 B2 * | 11/2004 | Chen .......................... 257/638 |
| 2003/0194847 A1 * | 10/2003 | Chen et al. ................. 438/407 |
| 2005/0074930 A1 * | 4/2005 | Chen et al. ................. 438/151 |

* cited by examiner

*Primary Examiner*—David Nelms
*Assistant Examiner*—Calvin Lee

(57) ABSTRACT

An amorphous silicon layer is formed on a substrate, and then a protective layer and a reflective layer are formed in turn to form a film stack on portions of the amorphous silicon layer. The reflective layer is a metal material with reflectivity of laser, and the protective layer is able to prevent metal diffusion. When an excimer laser heats the amorphous silicon layer to crystallize the amorphous silicon, nucleation sites are formed in the amorphous silicon layer under the film stack of the protective layer and the reflective layer. Next, laterally expanding crystallization occurs in the amorphous silicon layer to form poly-silicon having crystal grains with size of micrometers and high grain order.

19 Claims, 5 Drawing Sheets

METHOD OF FORMING POLY-SILICON CRYSTALLIZATION

FIELD OF THE INVENTION

The present invention relates to a method of fabricating a poly-silicon film of thin film transistors, and more particularly, to a method of forming poly-silicon crystallization.

BACKGROUND OF THE INVENTION

Polycrystalline silicon (poly-Si) thin film has lately attracted considerable attention due to its special physical properties and low cost in thin film transistor (TFT) fabrication, especially in the application of thin film transistor liquid crystal displays (TFT-LCD).

Because poly-Si is an aggregate of single crystal grains and there are thus many grain boundaries, the electrical performance of poly-Si is better than that of amorphous silicon (a-Si) but worse than that of single crystalline silicon. Therefore, grain size enlargement and grain boundaries reduction for poly-Si are very important for improving device performance. The field of display technology is highly focused on development of a flat panel display with higher performance, and thus the electrical performance of poly-Si thin film transistors needs to be improved.

The conventional methods for fabricating poly-Si film are solid phase crystallization (SPC) and direct chemical vapor phase deposition (CVD), but SPC is not applicable to flat panel display fabrication because the upper-limit process temperature of a glass substrate is 650° C., and the grain size of poly-Si is as small as 100 nm in SPC and CVD, therefore the performance of poly-Si film is limited. Besides, metal induced lateral crystallization (MILC) is also used, but the quality of the poly-Si film is affected by metal diffusion issues.

The excimer laser annealing (ELA) method is currently the most commonly used poly-Si film fabrication method. In ELA, the grain size of poly-Si is about 300–600 nm, and the carrier mobility of poly-Si film can reach to 200 $cm^2$/V-s. However, ELA is still not sufficient for future flat panel displays with high performance. Besides, the grain location and order are not uniform because of irregular laser energy deviation, and the electrical performance of devices, such as carrier mobility and uniformity of threshold voltage ($V_{th}$), is decreased.

The characteristics of poly-Si devices depend on the quality of poly-Si film; crystal grain size affects the carrier mobility directly. The existence of grain boundaries and rough surface of poly-Si film resulting from crystallization all lead to a rise in $V_{th}$ and leakage current, and a decrease in carrier mobility and device stability. Therefore, in addition to trying to enlarge the crystal grain size, grain location and grain order control are also ways of decreasing the grain boundary effect in channels for improving device performance.

SUMMARY OF THE INVENTION

An objective of the present invention is to provide a method of forming poly-Si crystallization, which method can be applied to flat panel display fabrication. Further, the present invention also provides a method for controlling grain location and grain size, and smoothness of poly-Si film surface is achieved by this invention.

A metal material with reflectivity to lasers is used as a reflective layer to form a thermal gradient in an a-Si film by stopping the laser energy from transferring to portions of the a-Si film, and then lateral growth crystallization takes place to form poly-Si grains having a grain size of micrometers with high grain order. In addition to the metal material, a protective layer with resistance for metal diffusion is also utilized to prevent metal from diffusing to the a-Si film.

According to the aforementioned objectives of the present invention, a method of forming poly-Si crystallization is provided. According to one preferred embodiment of this invention, an a-Si layer is formed on a substrate; then a protective layer, and a reflective layer are formed in turn to form a film stack on the a-Si layer. The protective layer and the reflective layer are patterned to form an opening exposing a portion of the a-Si layer, and excimer laser annealing is then performed to crystallize the a-Si layer. The reflective layer is a metal material with reflectivity to lasers, and the protective layer is a non-metal material with resistance to metal diffusion.

The a-Si layer in the opening is fully melted after absorbing laser energy directly, while the a-Si layer covered with the reflective layer is unable to absorb laser energy completely. The temperature of the melted silicon layer in the opening is much higher than that covered with the reflective layer, and therefore nucleation sites are formed in the melted silicon layer covered with the reflective layer after cooling. Next, lateral growth crystallization takes place towards the opening, and finally poly-Si having grain size of micrometers with high grain order is obtained.

According to another preferred embodiment of this invention, an a-Si layer is formed on a substrate and then a protective layer and a reflective layer are formed in turn to form a film stack on the a-Si layer. The protective layer and the reflective layer are patterned to form an opening exposing a portion of the a-Si layer, and a first excimer laser annealing is then performed to crystallize the a-Si layer. The reflective layer is a metal material with reflectivity to lasers, and the protective layer is a non-metal material with resistance to metal diffusion. Therefore, nucleation sites are formed in the melted silicon layer covered with the reflective layer after cooling, and lateral growth crystallization then takes place towards the opening, and a poly-Si layer is finally obtained.

Next, the reflective layer and the protective layer are removed. Then a second excimer laser annealing is performed to re-crystallize the poly-Si layer. The poly-Si layer is crystallized more completely, and the poly-Si with smooth surface morphology is also achieved. Thus, the smooth poly-Si layer having grain size of micrometers with high grain order is obtained.

With the application of the poly-Si crystallization forming method of the present invention, not only is the poly-Si layer having grain size of micrometers formed, but the poly-Si layer with high grain order is obtained by controlling grain location and grain growth direction. Additionally, thin film transistor fabrication is also combined with this invention. Poly-Si grains in channel regions can be controlled with larger size and high order, and grain boundaries in channel regions are reduced, and carrier mobility of thin film transistors is thus greatly increased.

In addition, metal pollution is prevented by utilizing the protective layer, and a poly-Si with smooth surface morphology is also achieved by a second laser annealing at the same time. According to aforementioned advantages of the invention, a TFT device with good quality and higher electrical performance is fabricated by employing this invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

The present invention uses a metal material with reflectivity to lasers as a reflective layer for blocking laser energy in a specific location, and places the reflective layer to stop laser energy form transferring to portions of the a-Si layer, besides a protective layer for preventing metal diffusion on portions of the a-Si layer is also used. In the laser annealing process, the a-Si layer covered with the reflective layer is unable to absorb laser energy completely and forms a low temperature region, while the a-Si layer in other regions is melted by absorbing laser energy directly to form a high temperature region. Therefore, a temperature gradient is formed in the a-Si layer, and nucleation sites are formed in the low temperature regions of the a-Si layer for controlling grain growth location. The temperature gradient will also induce a lateral crystallization. Polysilicon (poly-Si) grain grows laterally from the low temperature region to the high temperature region. A poly-Si layer having crystal grains with larger size and high order is thus formed. Besides, the poly-Si layer with smooth interface also can be obtained by performing a second laser annealing.

Embodiment 1

Figure 1A:
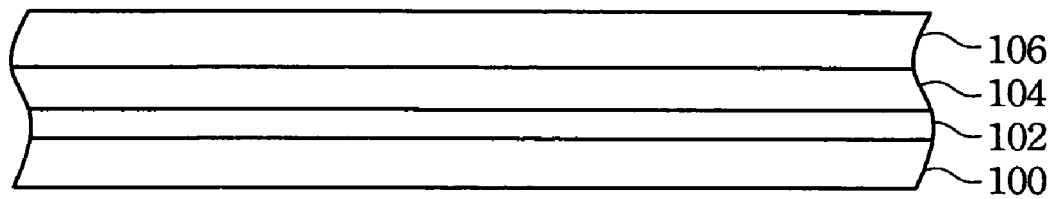
FIGS. 1A–1C are cross-sectional schematic diagrams showing the process for forming poly-Si crystallization in accordance with the first preferred embodiment of the present invention.

The present invention discloses a method of forming poly-Si crystallization. Referring to FIG. 1A, an a-Si layer 102 is first formed on a substrate 100 by, for example, plasma enhanced chemical vapor phase deposition (PECVD) or physical vapor deposition (PVD). The substrate 100 may be a glass substrate for display fabrication, and the preferred thickness of the a-Si layer 102 is about 50 nm. Further, dehydrogenation is then performed on the a-Si layer 102 to prevent a hydrogen explosion during the subsequent laser annealing.

Next, a protective layer 104 and a reflective layer 106 are formed in turn on the a-Si layer 102. The protective layer 104 is between the reflective layer 106 and the a-Si layer 102 for protecting the a-Si layer 102 from metal pollution by the reflective layer 106. The protective layer 104 is a non-metal material such as silicon oxide ($SiO_x$) with resistance for metal diffusion, and the preferred thickness of the protective layer 104 is about 100 nm. The reflective layer 106 is a metal material such as moly-tungsten (MoW) with reflectivity to lasers for stopping laser energy from transferring to the a-Si layer 102, and the preferred thickness of the reflective layer 102 is about 100 nm.

Figure 1B:
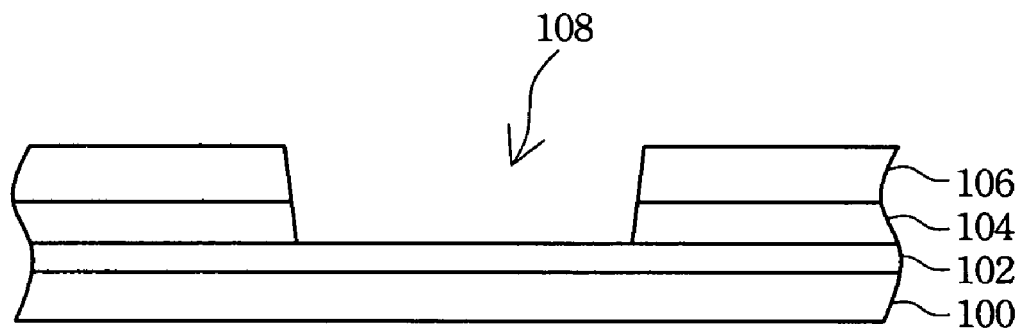

Then, referring to FIG. 1B, the protective layer 104 and the reflective layer 106 are patterned by, for example, photolithography and etching simultaneously to form an opening 108 exposing a portion of the a-Si layer 102.

Figure 1C:
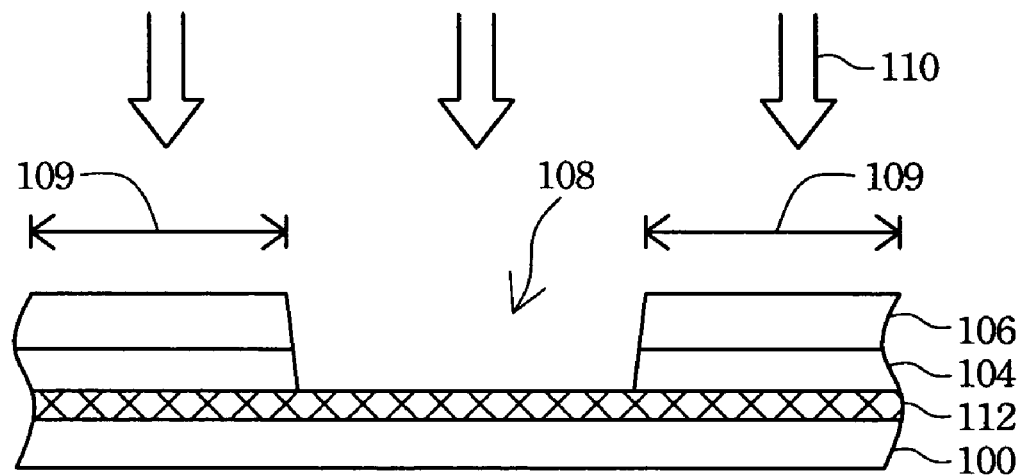

Finally, referring to FIG. 1C, laser annealing is performed, preferably with a XeCl excimer laser, and the a-Si layer 102 in the opening 108 is melted by absorbing energy from the laser 110 to become the melted a-Si layer 102 with a high temperature. The a-Si layer 102 under the protective layer 104 is a region 109, and the region 109 is unable to absorb laser energy completely due to the reflective layer 106 reflecting the laser 110. Therefore, a portion of laser energy is stopped from transferring to the a-Si layer 102 in the region 109, and the a-Si layer 102 in the region 109 has a lower temperature as compared with that in the opening 108. The preferable laser energy used is about 330–450 $mJ/cm^2$.

Figure 4:
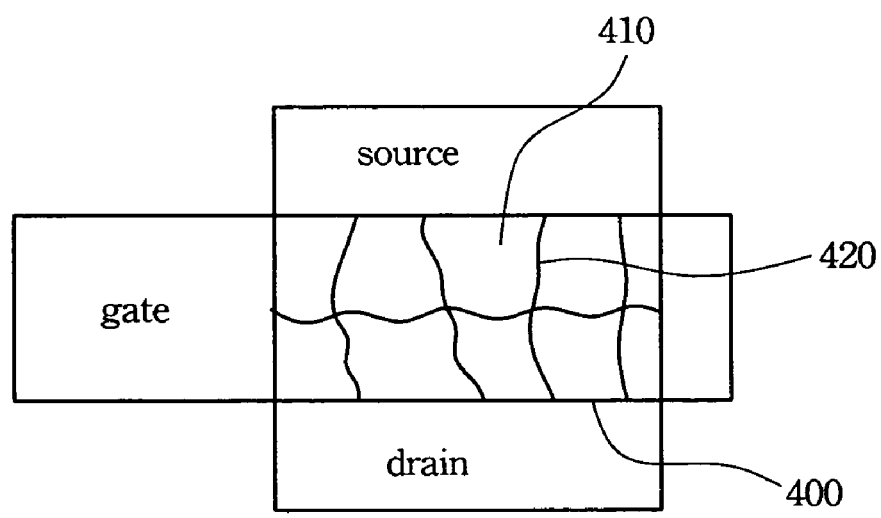
FIG. 4 is a partial-enlarged top view of a poly-Si being formed in accordance with the present invention.

For the aforementioned structural design, nucleation sites are formed in the low temperature region 109 of the melted a-Si layer 102 after cooling, and then crystallization is driven to grow laterally towards the melted a-Si layer 102 in the opening 108 with a high temperature. A super lateral growth poly-Si layer 112 is formed consequently, and super lateral growth grains are controlled in the poly-Si layer 112 in the opening 108. Referring to FIG. 4, a partial-enlarged top view of the poly-Si layer 112 is shown in FIG. 4. When the embodiment of the present invention is employed, grains 410 in the poly-Si 400 (i.e., the poly-Si layer 112) have a grain size of micrometers and high grain order is obtained by controlling crystal location and crystal growth direction. Thus the number of grain boundaries 420 is reduced, and carrier mobility of poly-Si 400 is improved.

Embodiment 2

The present invention discloses another method of forming poly-Si crystallization. In addition to a reflective layer having reflectivity to lasers and a protective layer for prevent metal pollution, a second laser annealing is also added to provide another method for controlling poly-Si crystallization and smoothing a poly-Si surface.

Figure 2A:
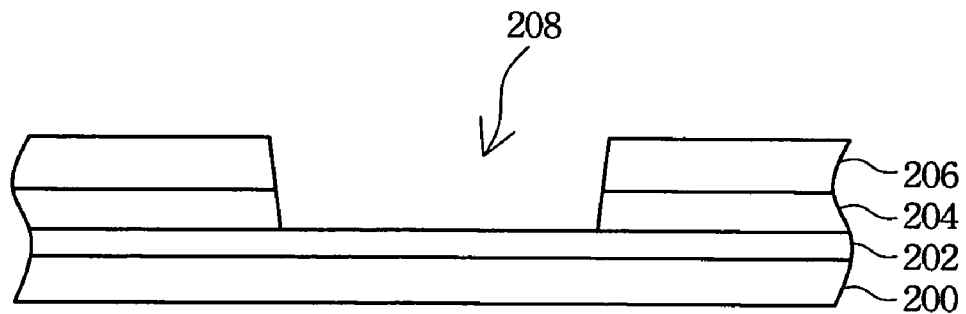
FIGS. 2A–2D are cross-sectional schematic diagrams showing the process for forming poly-Si crystallization in accordance with the second preferred embodiment of the present invention.

Referring to FIG. 2A, an a-Si layer 202 is first formed on a substrate 200 by, for example, PECVD or PVD, and dehydrogenation is then performed on the a-Si layer 202 to prevent a hydrogen explosion during the subsequent laser annealing. The substrate 200 may be a glass substrate for display fabrication, and the preferred thickness of the a-Si layer 202 is about 50 nm. Next, a protective layer 204 and a reflective layer 206 are formed in turn on the a-Si layer 202, and the protective layer 204 and the reflective layer 206 are patterned by, for example, photolithography and etching simultaneously to form an opening 208 exposing a portion of the a-Si layer 202. The protective layer 204 is a non-metal material such as $SiO_x$ with resistance for metal diffusion, and the preferred thickness of the protective layer 204 is about 100 nm. The reflective layer 206 is a metal material such as MoW with reflectivity of laser, and the preferred thickness of the reflective layer 206 is about 100 nm.

Figure 2B:
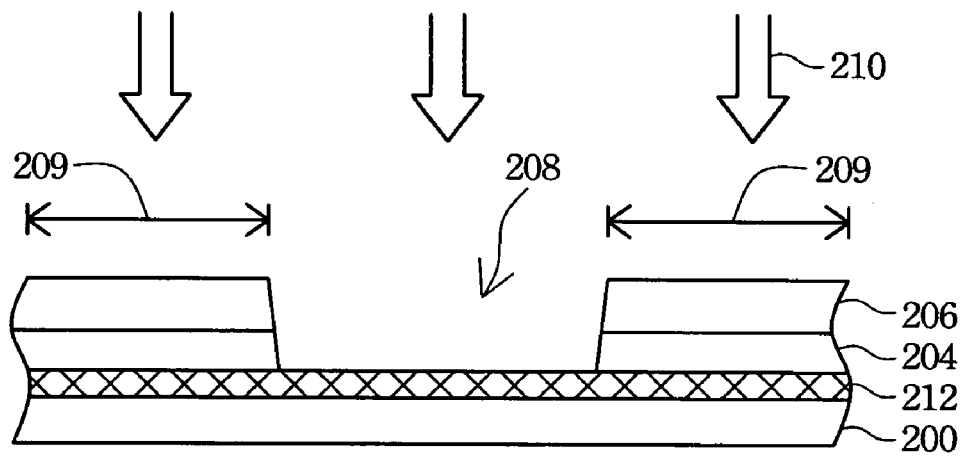

Then, referring to FIG. 2B, a first laser annealing is performed, preferably with a XeCl excimer laser, and the a-Si layer 202 in the opening 208 is melted by absorbing energy from the laser 210 to become the melted a-Si layer 202 with a high temperature. The a-Si layer 202 in other region 209 is unable to absorb laser energy completely due to the reflective layer 206 covered reflecting the laser 210.

Therefore, a portion of laser energy is stopped from transferring to the a-Si layer 202 in the region 209, and the a-Si layer 202 in the region 209 has a lower temperature as compared with that in the opening 208. The preferable laser energy used is about 330–450 mJ/cm$^2$.

For the aforementioned structural design and the first laser annealing, nucleation sites are formed in the low temperature region 209 of the melted a-Si layer 202 after cooling, and then crystallization is driven to grow laterally towards the melted a-Si layer 202 in the opening 208 with a high temperature. A super lateral growth poly-Si layer 212 is formed consequently, and super lateral growth grains are controlled in the poly-Si layer 212 in the opening 208. A partial-enlarged top view of the poly-Si layer 212 is shown as FIG. 4.

Figure 2C:
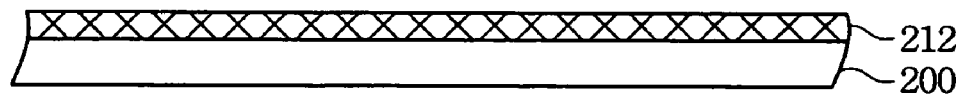

Next, referring to FIG. 2C, after the first laser annealing process, the protective layer 204 and the reflective layer 206 are fully removed to expose the poly-Si layer 212 without damaging the poly-Si layer 212. A preferred removal method is wet etching.

Figure 2D:
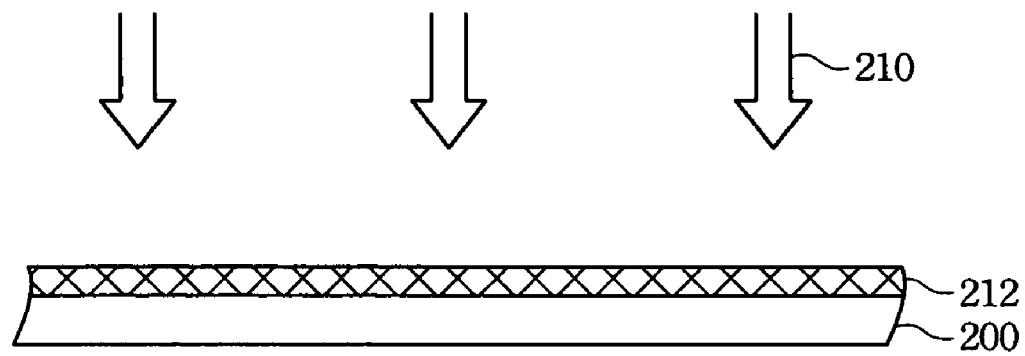

Finally, referring to FIG. 2D, a second laser annealing is performed, preferably with a XeCl excimer laser, and laser energy used in the second laser annealing is lower than that in the first laser annealing. The second laser annealing is used to form crystallization of the poly-Si 212 more completely and remove some ridges on surface of the poly-Si layer 212 due to crystallization, and the poly-Si layer 212 with a smooth surface is thus obtained.

Because the region 209 of the poly-Si layer 212 is covered with the protective layer 204 and the reflective layer 206 in the first laser annealing process, the poly-Si layer 212 has incomplete crystallization easily, and even some portions of the poly-Si layer 212 are not crystallized. Therefore, the second laser annealing with lower laser energy is performed after removing the protective layer 204 and the reflective layer 206, to re-crystallize the poly-Si layer 212, and the poly-Si layer 212 is re-crystallized completely without melting the original super lateral growth gains formed by the first laser annealing.

Further, smoothing the poly-Si layer 212 is achieved by the second laser annealing. The removal step for the protective layer 204 before the second laser annealing is also used to remove native oxides and weak lattices in crystals, and the surface of the poly-Si layer 212 is then melted partially to reconstruct the crystals by the second laser annealing. The surface roughness of the poly-Si layer 212 is thus reduced and the poly-Si layer 212 with a smooth surface is obtained. This is beneficial to film stack conditions and device properties in device fabrication.

Not only the carrier mobility of the poly-Si layer 212 formed by the second embodiment is improved because of grains having a grain size of micrometers and high grain order, but also the device characteristics is improved for a smooth surface of the poly-Si layer 212.

With the embodiments of the present invention employed, film materials chosen and structures designed, superior lateral growth grains is obtained merely by excimer laser annealing; in addition to grain size increase, crystal location and order of grains are also controlled well. Thus, the present invention can be further employed in TFT fabrication to form a poly-Si thin film layer with a grain size of micrometers and high grain order occurring in the channel regions, and a TFT with higher carrier mobility and good electrical performance is thus obtained.

Subsequent processes of conventional TFT fabrication are performed directly after a poly-Si layer is formed by the second embodiment, and a poly-Si TFT device is then obtained. Additionally, the protective layer and the reflective layer must be removed before performing subsequent processes of conventional TFT fabrication if the first embodiment is employed.

Embodiment 3

According to the aforementioned two preferred embodiments of the present invention, the protective layer and the reflective layer must be removed in TFT fabrication, and subsequent processes of TFT are then performed. But for the present invention, it is not necessary to remove the protective layer and the reflective layer in TFT fabrication.

The present invention discloses a further method of forming poly-Si crystallization combined with TFT fabrication to form a top-gate TFT device. In processes of TFT device fabrication, the poly-Si crystallization of the invention is formed simultaneously by employing a thin film structure.

Figure 3A:
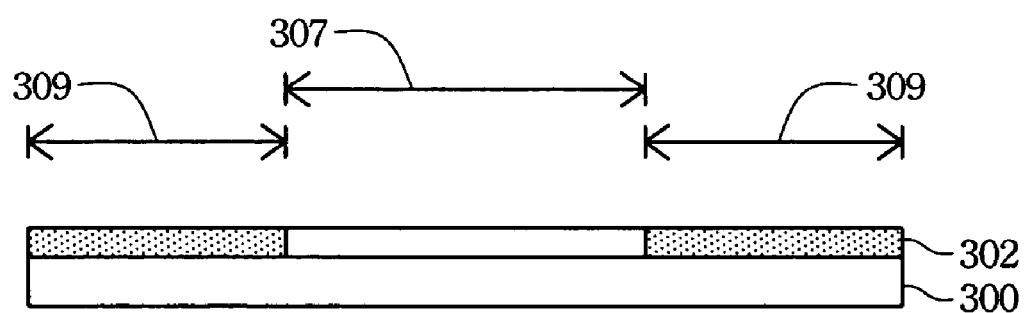
FIGS. 3A–3D are cross-sectional schematic diagrams showing the process for forming a thin film transistor in accordance with a preferred embodiment of the present invention.

FIGS. 3A–3D are cross-sectional schematic diagrams showing the process for forming a TFT in accordance with the third preferred embodiment of the present invention. The TFT formed is a top-gate TFT device. Referring to FIG. 3A, an a-Si layer 302 is first formed on a substrate 300, and dehydrogenation is then performed on the a-Si layer 302 to prevent a hydrogen explosion during the subsequent laser annealing. The substrate 300 may be a glass substrate, and the preferred thickness of the a-Si layer 302 is about 50 nm. Then, an ion-implantation is performed, and the a-Si layer 302 in regions 309 is implanted with ions to define a source and drain region, and the a-Si layer 302 in a region 307 is a channel region between the source and drain region.

Figure 3B:
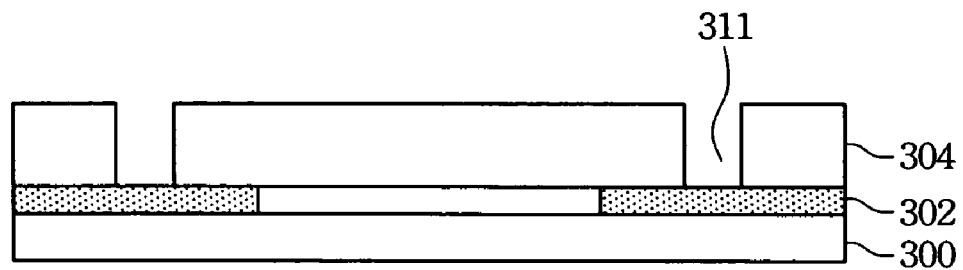

Next, referring to FIG. 3B, a dielectric interlayer 304 is formed on the a-Si layer 302, and the dielectric interlayer 304 is consequently patterned to form contact holes 311 that expose the a-Si layer 302 in the source and drain region. The dielectric interlayer 304 is, for example, a SiO$_x$ layer.

Figure 3C:
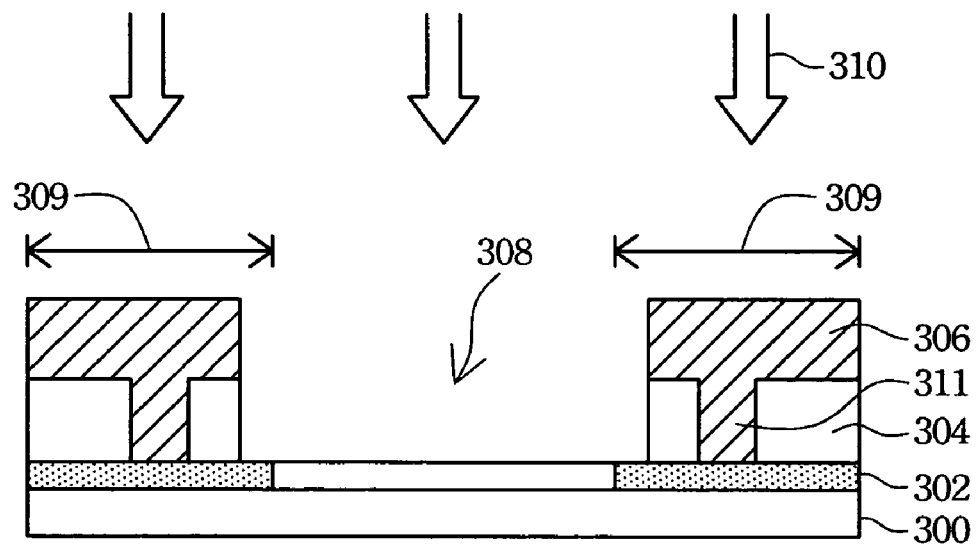

Referring to FIG. 3C, a source/drain (S/D) metal 306 is then formed on the dielectric interlayer 304 and in the contact holes 311 to contact the a-Si layer 302 in the source and drain region. The S/D metal 306 and the dielectric interlayer 304 are then patterned simultaneously to form a opening 308 exposing the a-Si layer 302 in the channel region 307, and excimer laser annealing is then performed, preferably with a XeCl excimer laser. The S/D metal 306 is a material with good electric conductivity such as MoW or aluminum (Al), and the S/D metal 306 is also reflective to lasers.

The dielectric interlayer 304 fabricated is considered a protective layer for partially separating the S/D metal 306 from the a-Si layer 302 to prevent metal diffusion. Further, the S/D metal 306 is considered a reflective layer for stopping laser energy from transferring to the a-Si layer 302 in regions 309. Therefore, in excimer laser annealing, only the a-Si layer 302 in the opening 308 is melted by absorbing energy completely from the laser 310 to become the melted a-Si layer 302 with a high temperature, and the a-Si layer 302 in the regions 309 is unable to absorb laser energy completely due to the S/D metal 306 reflecting the laser 310. A portion of laser energy is stopped from transferring to the a-Si layer 302 in regions 309, and thus the a-Si layer 302 in the source and drain regions 309 has a lower temperature as compared with that in the channel region 307.

Figure 3D:
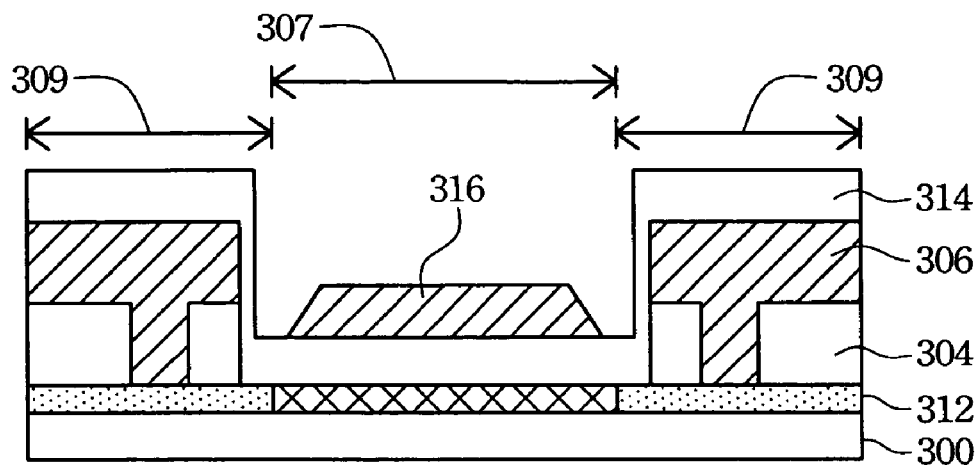

In accordance with films structure aforementioned, nucleation sites are formed in the source and drain regions 309 of the melted a-Si layer 302, and crystallization is driven to grow laterally towards the channel region 307 of the melted a-Si layer 302 after laser annealing and cooling. Therefore, a super lateral growth poly-Si layer 312 is formed consequently (as shown in FIG. 3D), and a crystal lateral growth region of the poly-Si is controlled in the channel region 307 precisely; that is, crystal grains having grain size of micrometers with high grain order occur in the channel region 307, and even single-crystal grains are further obtained. A partial-enlarged top view of the poly-Si layer 312 is shown in FIG. 4.

Finally, referring to FIG. 3D, a gate-insulating layer 314 is formed after poly-Si crystallization. The gate-insulating layer 314 is, for example, a $SiO_x$ layer. Then, a gate-metal 316 is formed by, for example, PVD and patterning on the gate-insulating layer 314. The gate-metal 316 is a material with good electric conductivity such as MoW or Al. A top-gate TFT is thus formed.

According to the aforementioned preferred embodiments of the present invention, with the application of the present invention, a poly-Si TFT with crystals well controlled is formed and carrier mobility is therefore improved. Crystal grains with larger size and high order are controlled in channel regions precisely by crystal location and grain growth direction control, and there is no metal diffusion issue due to use of a non-metal material as a protective layer. For the channel regions, increasing grain size of micrometers and control for grain order, grain growth direction, and crystal location all are capable of grain boundary reduction, and thus carrier mobility of TFT is promoted.

Further, with a second laser annealing employed, crystal quality of a poly-Si layer is improved, and smoothing the poly-Si layer surface is also achieved at the same time. Device performance is therefore promoted.

The present invention is not limited to use in TFT fabrication for flat panel display; other poly-Si TFT devices also can be fabricated by using the present invention to improve product efficiency. While the present invention has been disclosed with reference to the preferred embodiments of the present invention, it should not be considered as limited thereby. Various possible modifications and alterations by one skilled in the art can be included within the spirit and scope of the present invention, the scope of the invention is determined by the claims that follow.

What is claimed is:

1. A method of forming poly-silicon crystallization, comprising the steps of:
   forming an amorphous silicon layer on a substrate;
   forming a protective layer on the amorphous silicon layer;
   forming a reflective layer on the protective layer;
   patterning the protective layer and the reflective layer simultaneously to form an opening exposing a portion of the amorphous silicon layer; and
   laser annealing the amorphous silicon layer to form nucleation sites in the amorphous silicon layer under the protective layer and the reflective layer, wherein crystallization then grows towards the amorphous silicon layer in the opening to form a poly-silicon layer having a grain size of a micrometer with high grain order.

2. The method of claim 1, wherein the step of forming the amorphous silicon layer comprises plasma enhanced chemical vapor deposition (PECVD).

3. The method of claim 1, wherein the protective layer is a non-metal material with resistance to metal diffusion.

4. The method of claim 3, wherein the non-metal material comprises silicon oxide.

5. The method of claim 1, wherein the reflective layer is a metal material with reflectivity to lasers for stopping laser energy of the step of laser annealing from transferring to the amorphous silicon layer covered with the reflective layer.

6. The method of claim 5, wherein the metal material comprises moly-tungsten (MOW).

7. The method of claim 1, wherein the step of laser annealing comprises using a XeCl excimer laser light source.

8. The method of claim 1, wherein the step of laser annealing comprises laser energy of about 330–450 $mJ/cm^2$.

9. The method of claim 1, further comprising the steps of:
   removing the reflective layer and the protective layer to expose entirely the poly-silicon layer; and
   performing another laser annealing to re-crystallize the poly-silicon layer, wherein the poly-silicon layer is crystallized more completely and a poly-silicon layer with a smooth surface is also obtained.

10. A method of forming poly-silicon crystallization, comprising the steps of:
    forming an amorphous silicon layer on a substrate;
    forming a protective layer on the amorphous silicon layer;
    forming a reflective layer on the protective layer;
    patterning the protective layer and the reflective layer simultaneously to form an opening exposing a portion of the amorphous silicon layer; and
    performing a first laser annealing to form nucleation sites in the amorphous silicon layer under the protective layer and the reflective layer, wherein crystallization then grows towards the amorphous silicon layer in the opening to form a poly-silicon layer;
    removing the reflective layer and the protective layer to expose entirely the poly-silicon layer; and
    performing a second laser annealing to re-crystallize the poly-silicon layer, wherein the poly-silicon layer is crystallized more completely and smoothed, and finally a poly-silicon layer having a grain size of a micrometer with high grain order and a smooth surface is formed.

11. The method of claim 10, wherein the protective layer comprises a silicon oxide layer.

12. The method of claim 10, wherein the reflective layer is a metal material with reflectivity to lasers for stopping laser energy of the first step laser annealing from transferring to the amorphous silicon layer covered with the reflective layer.

13. The method of claim 12, wherein the metal material comprises moly-tungsten (MoW).

14. The method of claim 10, wherein the first laser annealing and the second laser annealing comprise using a XeCl excimer laser light source.

15. The method of claim 10, wherein the first laser annealing comprises laser energy of about 330–450 $mJ/cm^2$.

16. The method of claim 10, wherein the second laser annealing comprises lower laser energy than that of the first laser annealing.

17. The method of claim 10, wherein the step of removing the protective layer and the reflective layer is wet etching.

18. A method of fabricating a poly-Si TFT, comprising the steps of:
    forming an amorphous silicon layer on a substrate;
    dehydrogenating the amorphous silicon layer;
    ion implanting the amorphous silicon layer to form source/drain regions of the amorphous silicon layer;
    forming a dielectric interlayer on the amorphous silicon layer;
    patterning the dielectric interlayer to form contact holes exposing the source/drain regions of the amorphous silicon layer;

forming a source/drain metal on the dielectric interlayer and in the contact holes;

patterning the source/drain metal and the dielectric interlayer simultaneously to form a opening exposing a portion of the amorphous silicon layer;

laser annealing the amorphous silicon layer to form nucleation sites in the amorphous silicon layer covered with the source/drain metal, wherein crystallization then grows towards the amorphous silicon layer in the opening to form a poly-silicon layer;

forming a gate-insulating layer; and forming a gate metal on the gate-insulating layer.

19. The method of claim 18, wherein the source/drain metal has reflectivity to lasers for stopping laser energy of the step of laser annealing from transferring to the amorphous silicon layer covered with the source/drain metal.

* * * * *